United States Patent [19]
Butterworth et al.

[11] Patent Number: 5,847,507
[45] Date of Patent: Dec. 8, 1998

[54] FLUORESCENT DYE ADDED TO EPOXY OF LIGHT EMITTING DIODE LENS

[75] Inventors: Mark M. Butterworth, Santa Clara; Rene P. Helbing, Palo Alto, both of Calif.

[73] Assignee: Hewlett-Packard Company, Palo Alto, Calif.

[21] Appl. No.: 892,049

[22] Filed: Jul. 14, 1997

[51] Int. Cl.[6] .................................................. H01J 1/62
[52] U.S. Cl. ............................................ 313/512; 313/483
[58] Field of Search .................................. 313/483, 498, 313/501, 512, 110, 112

[56] References Cited

U.S. PATENT DOCUMENTS 3,875,456   4/1975   Kano et al. ............................... 313/501

*Primary Examiner*—Nimeshkumar Patel

[57] ABSTRACT

A process and apparatus is described to produce efficient light emission over a broad portion of the visible spectrum. A lens containing a fluorescent dye is over molded to a short wavelength light emitter (e.g., a blue LED or laser diode) placed within a reflector cup. The fluorescent dye absorbs at least a portion of the light emitted by the diode and re-emits light of a second, longer wavelength. Concentration of the dye within the lens can be varied to control the extent of a region within the lens where most of the light is re-emitted so the remaining portion of the lens can focus the light. One can readily and consistently tailor the color of the light emitted from the lens through selection of the number and types of fluorescent dyes added to the lens, and through their relative concentrations. Inventory is reduced and there are no additional steps required when building varied color LEDs. One simply controls the color of the LED being made by selecting from one of several possible fluorescent dye-containing lens epoxies.

21 Claims, 2 Drawing Sheets

FLUORESCENT DYE ADDED TO EPOXY OF LIGHT EMITTING DIODE LENS

BACKGROUND OF THE INVENTION

1. Field of the Invention

The present invention relates to light emitting diodes and, more particularly, to controlling the observed color of light emitted thereby.

2. Description of the Related Art

A Light Emitting Diode (LED) is a well-known form of solid state illuminator. LEDs are typically used as illuminators, indicators or displays. Traditionally, the most efficient LEDs have emitted light in the red portion of the light spectrum. It has been possible to shift the wavelength of the light emitted from a red LED by doping the diode using various impurities. However, this technique significantly reduces the efficiency of the device. This wavelength-dependent efficiency has hampered the usefulness of LEDs because it is desirable to provide efficient light emission across the entire range of the visible spectrum.

Recently, a new type of LED has been developed that operates most efficiently in the blue portion of the spectrum. Unlike red light, which is at the long-wavelength end of the visible spectrum, blue light is at the short-wavelength end of the visible spectrum. The relatively short wavelength of the blue light emitted permits the shifting of the light emitted from a blue LED. This is accomplished through fluorescence, a process whereby short wavelength light is absorbed and re-emitted as a longer wavelength light.

FIG. 1 illustrates a prior art white LED 100 that is made from a blue LED, e.g., the White LED lamp manufactured by Nichia Chemical Industries, LTD., Tokyo, Japan. The blue emitting Gallium Nitride (GaN) die 110 is attached and wire bonded into the reflector cup lead frame 120. Power is provided to the die 110 through leads 150 and 160. A blob of Cerium activated YAG (Yttrium Aluminum Garnet) phosphor 130 is placed on top of the LED die 110. This is then over-molded with the usual clear epoxy lens 140. The Ce:YAG re-emits a broadband yellow-green light and some unabsorbed original blue light also gets through layer 130. This combination results in a perceived emission of "white" light.

The addition of a phosphor layer to a blue die permits the development of an efficient light emission source of various wavelengths. However, this technique is not a panacea. The addition of the phosphor layer adds an extra step to the manufacturing process of the LEDs. To quickly meet customer demand, inventories for a wide range of color LEDs must be maintained, with each color having a different phosphor layer.

Furthermore, many commercial uses of LEDs require a low variability of light emission wavelength from die to die. This phosphor-layer technique can result in a great variability of the light wavelength emitted from die to die, effectively reducing the yield for LEDs produced by this method. Moreover, because an inorganic fluorescent material is used, the process is inherently inefficient. This is because inorganic fluorescents are composed of solid particles which re-emit light from their surface. This re-emitted light is blocked by other fluorescent particles in the layer, thereby reducing the amount of light ultimately emitted through the lens.

Thus, it can be seen that color shifting techniques impose efficiency limits upon light emitting diode devices, and hinder the use of these devices in many applications.

Therefore, there is an unresolved need for a technique that can create efficient light emitting diodes over a broad portion of the visible spectrum.

SUMMARY OF THE INVENTION

A process and apparatus is described to produce efficient light emitting diodes over a broad portion of the visible spectrum. A lens containing a fluorescent dye is over molded to a short wavelength (e.g., blue) light emitting die placed within a reflector cup. The fluorescent dye absorbs at least a portion of the light emitted by the diode and re-emits light of a second, longer wavelength. Concentration of the dye within the lens can be varied to control the extent of a region within the lens where most of the second wavelength light is re-emitted. This permits the remaining portion of the lens to focus the light in the manner of a traditional lens.

One can readily and consistently tailor the color of the light emitted from the lens through selection of the number and types of fluorescent dyes added to the lens, and through their relative concentrations. Furthermore, the lens is formed during the last step in the manufacturing process. Because the color of the LED is defined by what dyes are added to the lens, one can reduce inventory by maintaining a stock of lens-less LEDs. Then, when a particular color LED is required, the lens is formulated and added to the lens-less base stock.

Moreover, the addition of a lens is a normal step in the manufacture of a LED. Therefore, there are no additional steps required when building varied color LEDs. One simply controls the color of the LED being made by selecting from one of several possible fluorescent dye containing lens epoxies.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 1–2. Those skilled in the art will readily appreciate that the detailed description given herein with respect to these figures is for explanatory purposes, however, because the invention extends beyond these limited embodiments.

Figure 2:
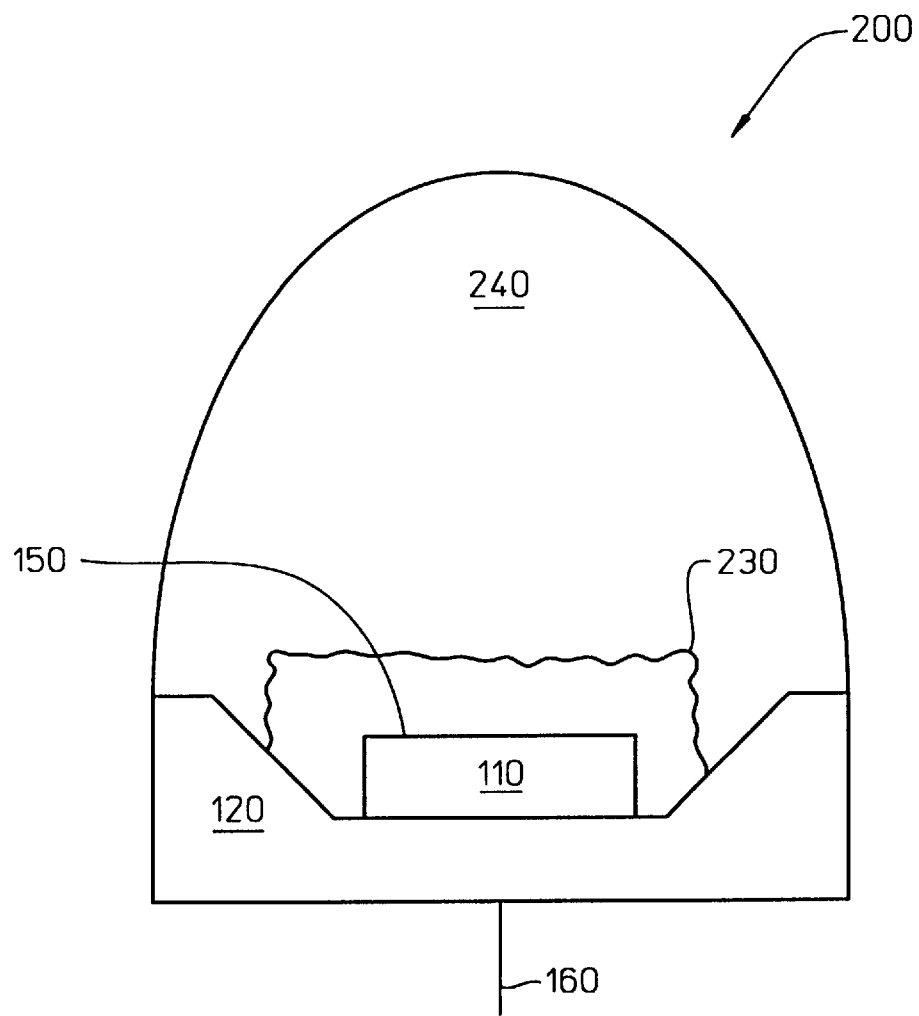
FIG. 2 is a diagram illustrating a light emitting diode having a lens containing a fluorescent dye as practiced according to one embodiment of the present invention.

FIG. 2 is a diagram illustrating a light emitting diode 200 having a lens 240 containing a fluorescent dye as practiced according to one embodiment of the present invention. The blue emitting Gallium Nitride (GaN) die 110 is attached and wire bonded into the reflector cup lead frame 120. Power is provided to the die 110 through leads 150 and 160. LED die 110 is then over-molded with an epoxy lens 240 containing a fluorescent dye. The fluorescent dye absorbs blue light emitted from die 110 and re-emits a longer wavelength light. Depending on the implementation, some unabsorbed original blue light may also pass through lens 240.

Figure 1:
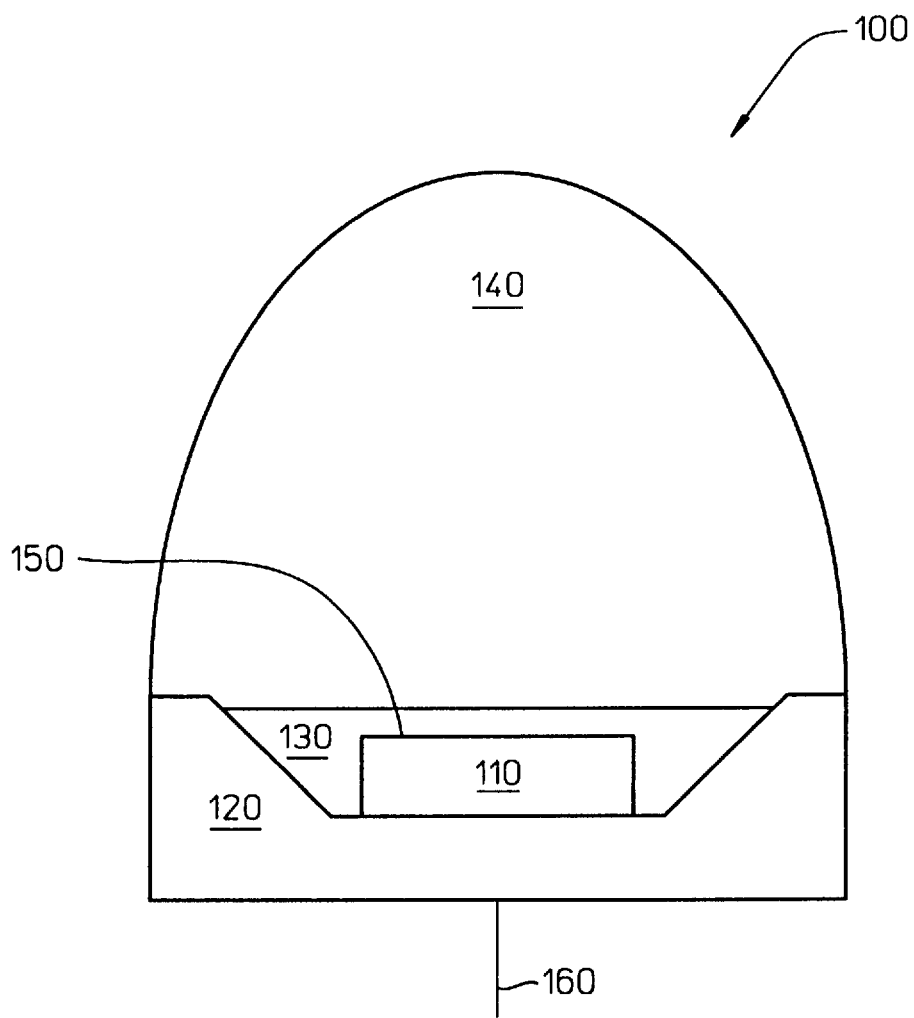
FIG. 1 is a diagram illustrating a prior art light emitting diode having a phosphor layer located between a light emitting die and a clear lens.

Thus, rather than adding a separate layer of inorganic phosphor 130 as shown in FIG. 1, the preferred embodiment of the present invention is to add an organic fluorescent dye to the epoxy used to mold the lens 240 as shown in FIG. 2. Different dyes have been successfully used to produce green, orange, yellow and red light. Moreover, a combination of dyes has been used to produce "white" light. Note that the single-wavelength nature of LEDs prohibit the production of white light through conventional LED color shifting techniques such as doping. Also, as will be shown below, this invention will permit a factory to only produce a single short wavelength (e.g., 380 nm) LED die and then build to order any LED color desired.

Unlike the approach of adding a phosphor layer between the die and the lens, it is counter-intuitive to dope the lens with a fluorescent dye. This is because the function of the fluorescent dye is to absorb light of one wavelength and emit light of another wavelength. However, the function of the lens is to concentrate and focus the light. Conventional wisdom dictates that the light emission function should be separate from the lens. If the dye is distributed throughout the lens, one would expect that light emitted near the outside surface of the lens would not be properly focused because it would exit the lens prematurely.

However, experiments have shown that light is not emitted uniformly throughout the lens. Rather, most of the light is emitted close to the LED die, as shown in FIG. 2 by region 230 of lens 240. The extent of the light generation region 230 of the lens 240 can be varied by adjusting the concentration of the dye in the lens. The higher the dye concentration, the shorter the absorption length. Because the light generation region is concentrated close to the LED die 110, the light emitted by the dye must pass through a substantial portion of the lens 240. Hence, the addition of a dye to lens 240 does not prevent lens 240 from concentrating and focusing light.

Various types of fluorescent materials may be added to the lens 240. For example, the following dyes from Lambda Physik, Inc., Fort Lauderdale, Fla., have been excited with 470 nm blue GaN LED.

Coumarin 6 (very nice green, very efficient)

Fluorol 7GA (yellow green, very efficient)

DOCI (green, short attenuation length)

Rhodamine 110 (yellow, very efficient)

DCM (orange, moderately efficient)

DCM special (orange red, moderately efficient)

Pyridine 1 (red, poor efficiency)

Pyridine 2 (deep red, poor efficiency)

Other examples of possible fluorescent materials include the following phosphors from Osram Sylvania, Inc., Danvers, Mass.:

Type 1330 Ag:ZnS (blue)

Type 1261 CuAuAl:ZnS (green)

Type 1260 CuAl:ZnS (green)

Type 236 Mg4(F)GeO5:Mn (red)

Type 251 Ce:YAG (yellow green)

Still other appropriate dyes include the dyes from Molecular Probes Inc., Eugene Oreg. These dyes are multiple transfer, organic dye. The stokes shift (color to color shift) is small for each dye, but with several dyes the color can be shifted up several times. 488 nm to 605 nm, 488 nm to 645 nm, and 488 nm to 685 nm types were tested and found to work well with 470 nm GaN LEDs.

The use of organic dyes appears to be more efficient than the use of inorganic materials. Inorganic dyes are powders, whereas organic dyes are liquids. The powder particles can block the light emitted by other particles. This is less of a problem in the case of liquids.

Regarding the material used to make the lens, any material commonly used to make LED lenses is suitable. UV stable polymer-dye combinations such as have been demonstrated in solar collectors, however, are particularly suitable. An example would be LISA (i.e., LIcht SAmmelnd or light collecting) plastics. Lisa products are plastics from Bayer, Pittsburgh, Pa. Furthermore, BASF Corp., Charlotte, N.C., makes lumogen dyes which do not degrade.

There are many benefits associated with placing a fluorescent dye in the lens of an LED. One can readily and consistently tailor the color of the light emitted from the lens through selection of the number and types of fluorescent dyes added to the lens, and through their relative concentrations. Furthermore, the lens is formed during the last step in the manufacturing process. Because the color of the LED is defined by what dyes are added to the lens, one can reduce inventory by maintaining a stock of lens-less LEDs. Then, when a particular color LED is required, the lens is formulated and added to the lens-less base stock.

Moreover, the addition of a lens is a normal step in the manufacture of a LED. Therefore, there are no additional steps required when building varied color LEDs. One simply controls the color of the LED being made by selecting from one of several possible fluorescent dye containing lens epoxies.

Another benefit of this approach over that of doping the die to shift wavelength, is that this approach provides a stable color. A blue LED that has had imperfections added to shift its light emission to a longer wavelength will tend to shift back toward blue when heated. This thermal shift does not occur when a fluorescent dye is used to shift wavelength.

The use of fluorescent dyes in the lens has been found to be a relatively efficient way to produce various colored LEDs. Red is the most efficient LED. A red LED can be shifted to green by doping the die. However, efficiency of the LED decreases as one shifts from red toward green. A red or blue LED that has been doped to green is very inefficient. The efficiency for green light attainable through fluorescent color shifting can be substantially greater than can be achieved by doping a red or blue LED to make it emit green light.

Furthermore, many commercial uses of LEDs require a low variability of light emission wavelength from die to die. This technique of adding a fluorescent dye to the lens can result in a reduced variability of the light wavelength emitted from die to die, effectively increasing the yield for LEDs produced by this method.

Although the above discussion was made in the context of a LED, it is to be understood that other light sources (e.g., laser diodes) will benefit from this technique. Moreover, although the above discussion was made in the context of a blue light emitter, it is to be understood that other light wavelength emitters will benefit from this technique.

The many features and advantages of the invention are apparent from the written description and thus it is intended by the appended claims to cover all such features and advantages of the invention. Further, because numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A light source, comprising:

a light emitter, to emit light of a first wavelength; and a lens to focus light emitted from the light source, the lens including a non-scattering fluorescent material to absorb light of the first wavelength and re-emit light of a second wavelength.

2. The light source as set forth in claim 1, wherein concentration of the fluorescent material in the lens is such that a significant portion of light re-emission occurs in a particular region of the lens, thereby permitting the lens to focus the re-emitted light.

3. The light source as set forth in claim 1, wherein the fluorescent material is an organic dye.

4. The light source as set forth in claim 1, comprising a second fluorescent material that absorbs light of the first wavelength and re-emits light of a third wavelength.

5. The light source as set forth in claim 1, comprising a second fluorescent material that absorbs light of the second wavelength and re-emits light of a third wavelength.

6. The light source as set forth in claim 1, wherein the light emitter is a light emitting diode.

7. The light source as set forth in claim 1, wherein the light emitter is a laser diode.

8. A method of providing a light source, the method comprising the steps of:

emitting light of a first wavelength from a light emitter; and using a lens to focus light emitted from the light source, the lens including a non-scattering fluorescent material to absorb light of the first wavelength and re-emit light of a second wavelength.

9. The light source method as set forth in claim 8, wherein concentration of the fluorescent material in the lens is such that a significant portion of light re-emission occurs in a particular region of the lens, thereby permitting the lens to focus the re-emitted light.

10. The light source method as set forth in claim 8, wherein the fluorescent material is an organic dye.

11. The light source method as set forth in claim 8, comprising the step wherein a second fluorescent material absorbs light of the first wavelength and re-emits light of a third wavelength.

12. The light source method as set forth in claim 8, comprising the step wherein a second fluorescent material absorbs light of the second wavelength and re-emits light of a third wavelength.

13. The light source method as set forth in claim 8, wherein the light emitter is a light emitting diode.

14. The light source method as set forth in claim 8, wherein the light emitter is a laser diode.

15. A light source, comprising:

a light emission means for emitting light of a first wavelength; and a focusing means for focusing light emitted from the light source, the focusing means including a non-scattering fluorescent means for absorbing light of the first wavelength and re-emitting light of a second wavelength.

16. The light source as set forth in claim 15, wherein concentration of the fluorescent means in the focusing means is such that a significant portion of light re-emission occurs in a particular region of the focusing means, thereby permitting the focusing means to focus the re-emitted light.

17. The light source as set forth in claim 15, wherein the fluorescent means is an organic dye.

18. The light source as set forth in claim 15, comprising a second fluorescent means for absorbing light of the first wavelength and re-emitting light of a third wavelength.

19. The light source as set forth in claim 15, comprising a second fluorescent means for absorbing light of the second wavelength and re-emitting light of a third wavelength.

20. The light source as set forth in claim 15, wherein the light emission means is a light emitting diode.

21. The light source as set forth in claim 15, wherein the light emission means is a laser diode.

* * * * *